(12) United States Patent
Teil et al.

(10) Patent No.: US 9,780,826 B2
(45) Date of Patent: Oct. 3, 2017

(54) MECHANICAL STRUCTURE WITH INTEGRATED ELECTRONIC COMPONENTS

(71) Applicant: Apple Inc., Cupertino, CA (US)

(72) Inventors: Romain A. Teil, Cupertino, CA (US); Michael B. Wittenberg, Cupertino, CA (US); Steven J. Martisauskas, Cupertino, CA (US); Kuo-Hua Sung, Cupertino, CA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 15/032,041

(22) PCT Filed: Oct. 31, 2013

(86) PCT No.: PCT/US2013/067889
§ 371 (c)(1),
(2) Date: Apr. 25, 2016

(87) PCT Pub. No.: WO2015/065461
PCT Pub. Date: May 7, 2015

(65) Prior Publication Data
US 2016/0277054 A1   Sep. 22, 2016

(51) Int. Cl.
*H01B 13/00* (2006.01)
*H04B 1/3888* (2015.01)
(Continued)

(52) U.S. Cl.
CPC .......... *H04B 1/3888* (2013.01); *G06F 1/1633* (2013.01); *G06F 1/1656* (2013.01);
(Continued)

(58) Field of Classification Search
CPC .. H05K 1/09; H05K 1/18; H05K 3/32; H05K 3/103; G06F 1/1633
(Continued)

(56) References Cited

U.S. PATENT DOCUMENTS

| | | | |
|---|---|---|---|
| 7,572,681 B1 * | 8/2009 | Huemoeller | ......... H01L 21/561 257/700 |
| 2011/0103028 A1 | 5/2011 | Malo et al. | |
| 2013/0215566 A1 | 8/2013 | Wu | |

FOREIGN PATENT DOCUMENTS

| | | |
|---|---|---|
| EP | 0162474 | 11/1985 |
| EP | 0168228 | 1/1986 |
| WO | WO 2011/069925 | 6/2011 |

OTHER PUBLICATIONS

International Search Report and Written Opinion dated Jun. 25, 2014, PCT/US2013/067889, 13 pages.

* cited by examiner

*Primary Examiner* — Lee Nguyen
(74) *Attorney, Agent, or Firm* — Brownstein Hyatt Farber Schreck, LLP (57) ABSTRACT

An electronic device may include a mechanical structure that mechanically supports the electronic device. One or more traces may be formed on one or more surfaces of the mechanical structure. Other electrical components may also be mounted on the surface of the mechanical structure and may or may not be connected to one or more of the traces. Additionally, one or more passivation layers may be formed on one or more of the surfaces, traces, and/or other electrical components and one or more traces and/or other electrical components may be intermixed with such passivation layers. In this way, the mechanical structure may be operable to function as an electrical component of the electronic device.

20 Claims, 7 Drawing Sheets

(51) Int. Cl.
*G06F 1/16* (2006.01)
*G06F 1/18* (2006.01)
*H05K 1/05* (2006.01)
*H05K 1/16* (2006.01)
*H05K 1/09* (2006.01)
*H05K 1/18* (2006.01)
*H05K 3/10* (2006.01)
*H05K 3/32* (2006.01)
B44C 1/22 (2006.01)
H05K 1/02 (2006.01)

(52) U.S. Cl.
CPC .............. *G06F 1/182* (2013.01); *G06F 1/183* (2013.01); *H05K 1/056* (2013.01); *H05K 1/09* (2013.01); *H05K 1/162* (2013.01); *H05K 1/18* (2013.01); *H05K 3/103* (2013.01); *H05K 3/32* (2013.01); *H05K 1/0289* (2013.01); *H05K 2201/0999* (2013.01); *H05K 2201/10015* (2013.01); *H05K 2201/10022* (2013.01); *H05K 2201/10151* (2013.01)

(58) Field of Classification Search
USPC ...................................................... 216/18–19
See application file for complete search history.

MECHANICAL STRUCTURE WITH INTEGRATED ELECTRONIC COMPONENTS

CROSS REFERENCE TO RELATED APPLICATION

This application is a 35 U.S.C. §371 application of PCT/US2013/067889, filed on Oct. 31, 2013, and entitled "Mechanical Structure with Integrated Electronic Components," which is incorporated by reference as if fully disclosed herein.

TECHNICAL FIELD

This disclosure relates generally to mechanical structures, and more specifically to mechanical structures that provide mechanical support for electronic devices and are integrated with electronic components.

BACKGROUND

Many electronic devices include one or more mechanical structures that provide structural support for the electronic devices and one or more electrical components that provide electronic functionality for the electronic devices. Such mechanical structures may include housings, supports, and/or any other such structure that provides mechanical support for an electronic device. Further, such electrical components may include sensors, processing units, input/output devices, communication components, storage media, electrical connection mechanisms, displays or display components, still image and/or video cameras, biometric devices, and/or other such electrical components.

However, every separate component included in an electronic device may increase the cost of the electronic device, the size of the electronic device, and/or weight of the electronic device. Particularly when the electronic device is a portable electronic device (such as a laptop computer, a cellular telephone, a tablet computer, a smart phone, a personal digital assistant, a mobile computer, a portable digital media player, and/or other portable electronic device), minimizing the size of the electronic device and/or weight of the electronic device may be important.

SUMMARY

The present disclosure discloses apparatuses and methods for mechanical structures with integrated electronic components. An electronic device may include a mechanical structure that mechanically supports the electronic device. One or more traces may be formed on one or more surfaces of the mechanical structure. Other electrical components may also be mounted on the surface of the mechanical structure and may or may not be connected to one or more of the traces (such as via solder).

In this way, the mechanical structure may be operable to function as an electrical component of the electronic device. Such combined functionality may reduce the total number of components that the electronic device would otherwise have to contain, reducing the cost, weight, power consumption, and/or space requirements of the electronic device.

In some implementations, the mechanical structure may be composed of a conductive material. In such implementations, one or more passivation layers may be formed on the surface of the mechanical structure. Such passivation layers may electrically insulate one or more of the traces from the electrically conductive material of the mechanical structure. In some cases of such implementations, one or more of the traces may be electrically insulated from the conductive material by the passivation layer whereas other traces are electrically connected to the conductive material. In such cases, traces and/or other electrical components electrically connected to the conductive material may be electrically connected to other traces and/or other electrical components via one or more electrical paths that pass through the electrically conductive material of the mechanical structure.

In various cases, the mechanical structure may include various layers of traces and/or passivation materials. For example, a first passivation layer may be formed on a surface of the mechanical structure, traces may be formed on the passivation layer, a second passivation layer may be formed on the traces, and additional traces may be formed on the second passivation layer. In such an example, one or more of the traces and/or additional traces may be electrically connected to and/or electrically isolated from the mechanical structure and/or one or more other of the traces, additional traces, and/or other electrical components. Such traces, additional traces, and passivation layers may form one or more sensors.

In various implementations, the mechanical structure may be composed of a nonconductive material. Such a nonconductive material may include carbon fiber and/or any other nonconductive material. Even in implementations where the mechanical structure is composed of a nonconductive material, passivation layers may be formed as part of the mechanical structure to electrically isolate one or more traces and/or other electrical components from one or more other traces and/or electrical components.

In one or more implementations, a method for constructing a mechanical structure integrated with an electrical component may include forming a mechanical structure to provide mechanical support for an electronic device. One or more traces may be laminated to one or more surfaces of the mechanical structure. In various cases, one or more passivation layers may be formed on one or more of the surfaces, the traces, and so on. Additionally, additional electrical components may be mounted to and/or formed on one or more of the surfaces, the traces, the passivation layers, and so on.

It is to be understood that both the foregoing general description and the following detailed description are for purposes of example and explanation and do not necessarily limit the present disclosure. The accompanying drawings, which are incorporated in and constitute apart of the specification, illustrate subject matter of the disclosure. Together, the descriptions and the drawings serve to explain the principles of the disclosure.

DETAILED DESCRIPTION

The description that follows includes sample apparatuses and methods that embody various elements of the present disclosure. However, it should be understood that the described disclosure may be practiced in a variety of forms in addition to those described herein.

The present disclosure discloses apparatuses and methods for mechanical structures with integrated electronic components. An electronic device may include a mechanical structure that mechanically supports the electronic device (such as a middle plate or other body element of a smart phone or other mobile computing device). One or more traces may be formed on one or more surfaces of the mechanical structure. Other electrical components may also be mounted on the surface of the mechanical structure and may or may not be connected to one or more of the traces (such as via solder). In this way, the mechanical structure may be operable to function as an electrical component of the electronic device. Such combined functionality may reduce the total number of components that the electronic device would otherwise have to contain, reducing the cost, weight, power consumption, and/or space requirements of the electronic device.

In some implementations, the mechanical structure may be composed of a conductive material (such as copper, silver, steel, metal, and/or any other alloy or conductive material). In such implementations, one or more passivation layers (such as FR4, other glass-reinforced epoxy laminates, and/or any other insulating material) may be formed on the surface of the mechanical structure. Such passivation layers may electrically insulate or isolate one or more of the traces from the electrically conductive material of the mechanical structure (and/or from each other and/or other electrical components).

In some cases of such implementations, one or more of the traces may be electrically insulated from the conductive material by the passivation layer whereas other traces are electrically connected to the conductive material. In such cases, traces and/or other electrical components electrically connected to the conductive material may be electrically connected to other traces and/or other electrical components via one or more electrical paths that pass through the electrically conductive material of the mechanical structure (such as from one surface of the mechanical structure to another portion of the same surface, from one surface of the mechanical structure through the mechanical structure to an opposing surface, and so on).

In various cases, the mechanical structure may include various layers of traces and/or passivation materials. For example, a first passivation layer may be formed on a surface of the mechanical structure, traces may be formed on the passivation layer, a second passivation layer may be formed on the traces, and additional traces may be formed on the second passivation layer. In such an example, one or more of the traces and/or additional traces may be electrically connected to and/or electrically isolated from the mechanical structure and/or one or more other of the traces, additional traces, and/or other electrical components. Such traces, additional traces, and passivation layers may form one or more sensors (such as one or more capacitive sensors).

In various implementations, the mechanical structure may be composed of a nonconductive material. Such a nonconductive material may include carbon fiber and/or any other nonconductive material. Even in implementations where the mechanical structure is composed of a nonconductive material, passivation layers may be formed as part of the mechanical structure to electrically isolate one or more traces and/or other electrical components from one or more other traces and/or electrical components.

In one or more implementations, a method for constructing a mechanical structure integrated with an electrical component may include forming a mechanical structure to provide mechanical support for an electronic device. One or more traces may be laminated to one or more surfaces of the mechanical structure. In various cases, one or more passivation layers may be formed on one or more of the surfaces, the traces, and so on. Additionally, additional electrical components may be mounted to and/or formed on one or more of the surfaces, the traces, the passivation layers, and so on.

Figure 1A:
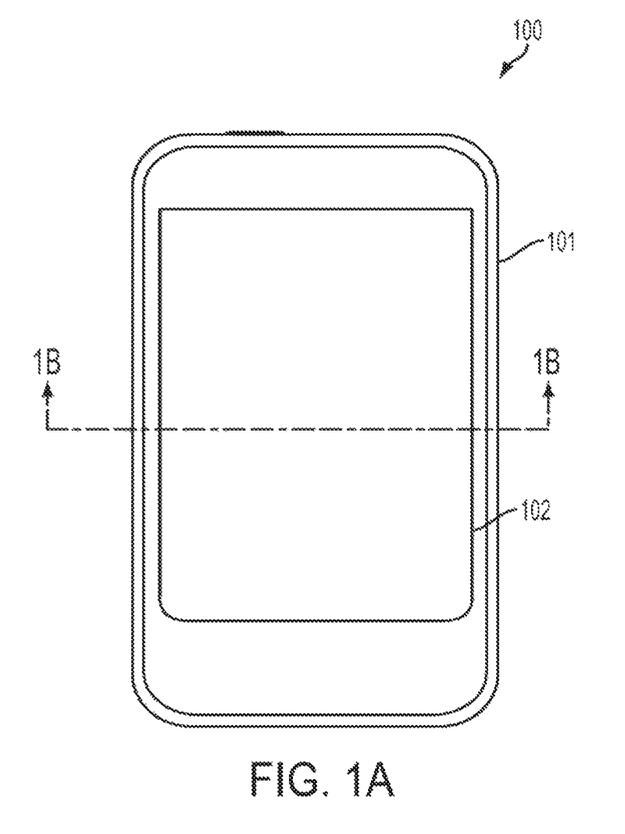
FIG. 1A is a top view of an example electronic device.

FIG. 1A is a top view of an example electronic device 100. As illustrated, the electronic device is a smart phone that includes a housing 101 and a screen 102. However, it is understood that this is an example. In various implementations, the electronic device may be any kind of electronic device such as a laptop computer, a desktop computer, a cellular telephone, a tablet computer, a smart phone, a personal digital assistant, a mobile computer, a portable digital media player, a portable electronic device, and/or any other kind of electronic device.

In various cases, the electronic device 100 may include various electrical components not shown. Such components may include one or more processing units, one or more input/output components, one or more communication components, one or more non-transitory storage media (which may take the form of, but is not limited to, a magnetic storage medium; optical storage medium; magneto-optical storage medium; read only memory; random access memory; erasable programmable memory; flash memory; and so on), and/or any other components. In some cases, the processing unit may execute instructions stored in the non-transitory storage medium to perform one or more electronic device functions.

Figure 1B:
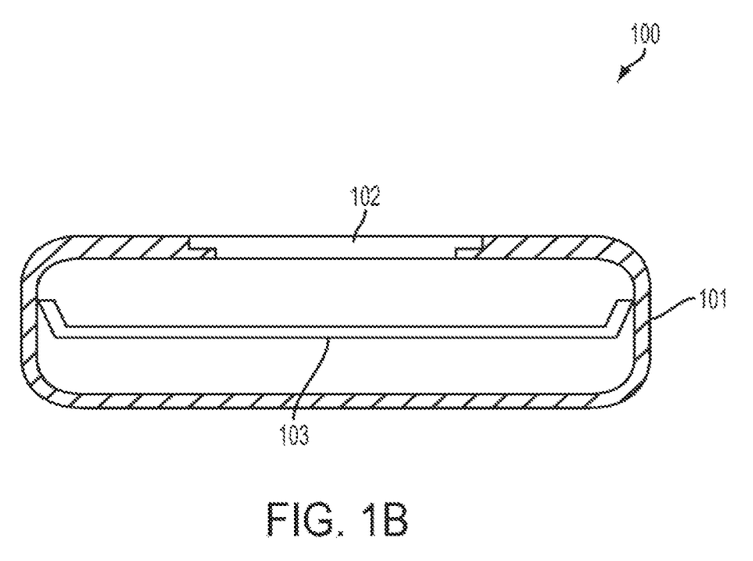
FIG. 1B is a front cross sectional view of the example electronic device of FIG. 1A, illustrating a mechanical structure of the electronic device, taken along line 1-1 of FIG. 1A.

FIG. 1B is a front cross sectional view of the example electronic device 100 of FIG. 1A, illustrating a mechanical structure of the electronic device, taken along line 1-1 of FIG. 1A. As illustrated, the electronic device includes a mechanical structure 103.

As illustrated, the mechanical structure 103 is a middle plate body element that provides mechanical support for the electronic device 100 by stiffening the electronic device (such as stiffness against crushing from the sides, twisting of the electronic device, and so on). However, it is understood that this is an example and in various implementations the mechanical structure may be any structure or body element (such as one or more portions of a housing of the electronic device and so on) that provides mechanical support for the electronic device.

Further, as illustrated, the mechanical structure 103 is a middle plate that extends across the housing 101 of the electronic device 100. However, in other implementations, such a middle plate may only occupy a portion of the housing of the electronic device while still mechanically supporting the electronic device.

Figure 2A:
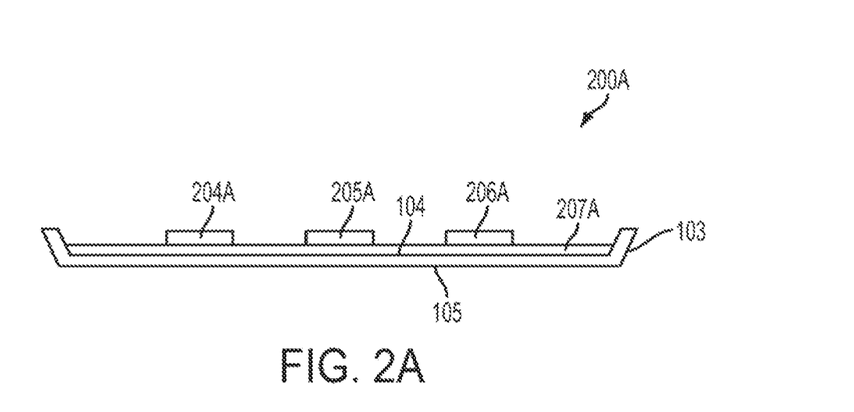
FIG. 2A is a side view of a first example of a mechanical structure. The mechanical structure may be the mechanical structure of FIG. 1B.

FIG. 2A is a side view of a first example of a mechanical structure 103. The mechanical structure may be the mechanical structure 103 of FIG. 1B. As illustrated, a passivation layer 207A (which may be composed of FR4, other glass-reinforced epoxy laminates, and/or any other insulating material) is formed on a surface 104 of the mechanical structure 103. As further illustrated, a number of electrically conducive traces 204A, 205A, and 206A (which may be formed of any electrically conductive material such as copper, silver ink, and/or other such conductive material suitable for forming traces) are formed on the passivation layer 207A.

In this example, the mechanical structure 103 may be composed of a conductive material (such as copper, silver, steel, metal, and/or any other alloy or conductive material). As such, the passivation layer 207A may electrically insulate (or isolate) the mechanical structure from the electrically conducive traces 204A, 205A, and 206A and/or the electrically conducive traces 204A, 205A, and 206A from each other.

Figure 2B:
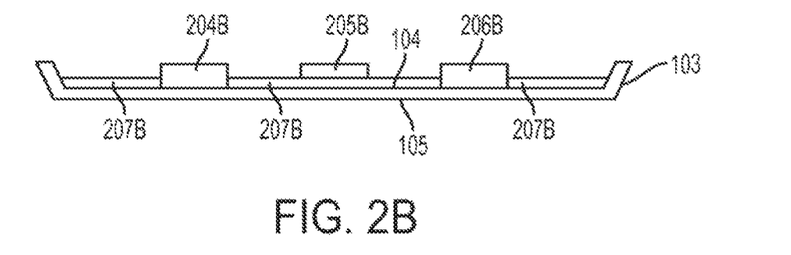
FIG. 2B is a side view of a second example of a mechanical structure. The mechanical structure may be the mechanical structure of FIG. 1B.

FIG. 2B is a side view of a second example of a mechanical structure 103. The mechanical structure may be the mechanical structure 103 of FIG. 1B. As illustrated, a passivation layer 207B is formed on portions of the surface 104 of the mechanical structure 103. As further illustrated, a number of electrically conducive traces 204B and 206B are formed on portions of the surface 104 and the electrically conductive trace 205B is formed on the passivation layer 207A.

In this example, the mechanical structure 103 may be composed of a conductive material. As such, the passivation layer 207B may electrically insulate (or isolate) the mechanical structure from the electrically conducive trace 205B and/or the electrically conducive traces 204B and 206B from the electrically conductive trace 205B.

However, as illustrated, the passivation layer 207B may not electrically insulate the traces 204B and 206B from the mechanical structure 103 and/or from each other. As such, the traces 204B and 206B and the mechanical structure may be electrically connected and one or more electrical paths may be formed between the traces 204B and 206B that pass through the mechanical structure.

Figure 2C:
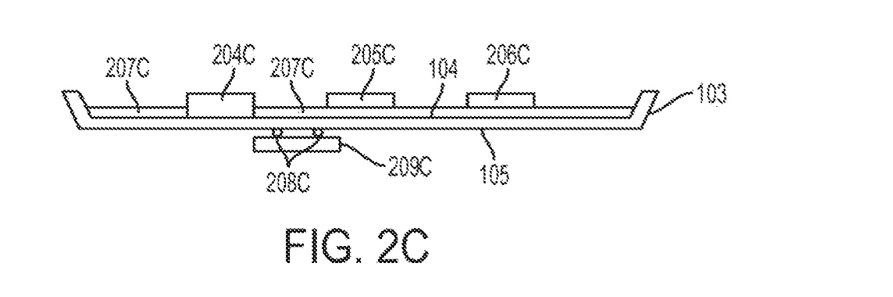
FIG. 2C is a side view of a third example of a mechanical structure. The mechanical structure may be the mechanical structure of FIG. 1B.

FIG. 2C is a side view of a third example of a mechanical structure 103. The mechanical structure may be the mechanical structure 103 of FIG. 1B. As illustrated, a passivation layer 207C is formed on portions of the surface 104 of the mechanical structure 103. As further illustrated, a number of electrically conducive traces 205C and 206C are formed on the passivation layer 207C and the electrically conductive trace 204C is formed on portions of the surface 104. Additionally, an electrical component 209C is mounted to an opposing surface 105 of the mechanical structure via beads of solder 208C.

In this example, the mechanical structure 103 may be composed of a conductive material. As such, the passivation layer 207C may electrically insulate (or isolate) the mechanical structure from the electrically conducive traces 205C and 206C and/or the electrically conducive traces 205C and 206C from the electrically conductive trace 204C and the electrical component 209C.

However, as illustrated, the passivation layer 207C may not electrically insulate the trace 204C from the mechanical structure 103 and/or from the electrical component 209C (or the electrical component 209C from the mechanical structure). As such, the trace 204C, the electrical component 209C, and the mechanical structure may be electrically connected and one or more electrical paths may be formed between the trace 204C and the electrical component 209C that pass through the mechanical structure from the surface 104 to the opposing surface 105.

Figure 2D:
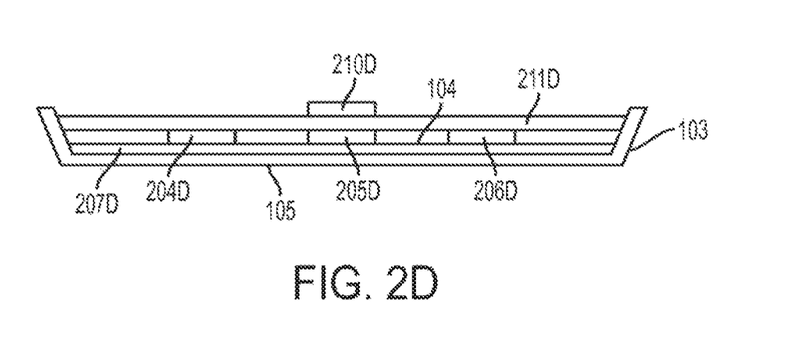
FIG. 2D is aside view of a fourth example of a mechanical structure. The mechanical structure may be the mechanical structure of FIG. 1B.

FIG. 2D is a side view of a fourth example of a mechanical structure 103. The mechanical structure may be the mechanical structure 103 of FIG. 1B. As illustrated, a passivation layer 207D is formed on a surface 104 of the mechanical structure 103. As further illustrated, a number of electrically conducive traces 204D, 205D, and 206D are formed on the passivation layer 207D. Additionally, an additional passivation layer 211D is formed over the electrically conducive traces 204D, 205D, and 206D and an additional electrically conductive trace 210D is formed over the additional passivation layer 211D.

In this example, the mechanical structure 103 may be composed of a conductive material. As such, the passivation layer 207D may electrically insulate (or isolate) the mechanical structure from the electrically conducive traces 204D, 205D, and 206D and/or the electrically conducive traces 204D, 205D, and 206D from each other. Further, the additional passivation layer 211D may electrically insulate (or isolate) the electrically conducive traces 204D, 205D, and 206D from the additional electrically conductive trace 210D.

In this example, the electrically conductive traces 205D and 210D may form at least portions of one or more sensors, such as one or more capacitive sensors. In such a case, the electrically conductive traces 205D and 210D may (respectively) be row and columns that have a mutual capacitance. However, when an object (such as a human finger) is brought into proximity with the electrically conductive trace 210D, the capacitance may change and this capacitance change may be detected (which may form part of determining whether or not a user has touched an electronic device, such as the electronic device 100, with one or more of the user's fingers).

Although the examples illustrated in FIGS. 2A-2D and described above describe the mechanical structure 103 as composed of an electrically conductive material, it is understood that this is for the purposes of example. In other implementations, the mechanical structure may be composed of a nonconductive material (such as carbon fiber and/or any other nonconductive material). In such cases, a passivation layer may not separate traces or other electrical components from the surface of the mechanical structure. However, even in such implementations, one or more passivation layers may be intermixed with one or more layers of traces and/or other components in order to insulate or isolate some of the various traces and/or other electrical components from each other.

Figure 3:
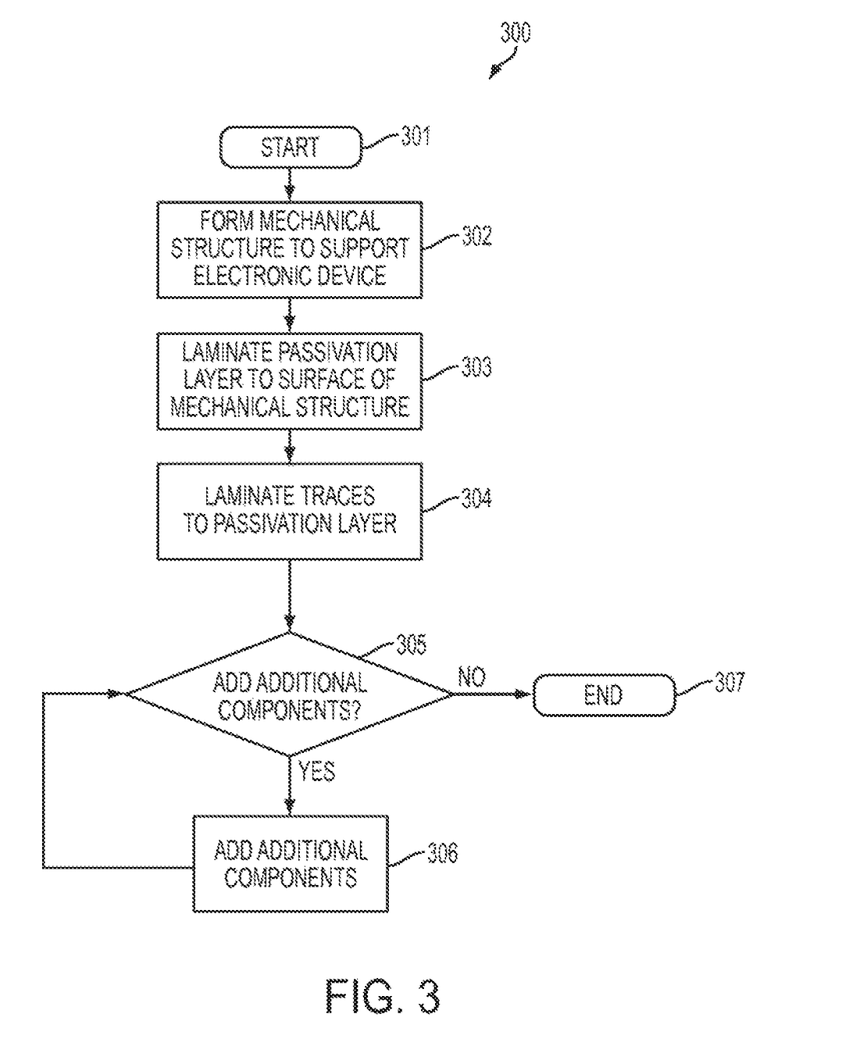
FIG. 3 is a flow chart illustrating an example method for constructing a mechanical structure integrated with an electrical component. The mechanical structure may be the mechanical structures of FIGS. 1B-2D and/or any other suitable mechanical structure.

FIG. 3 is a flow chart illustrating an example method 300 for constructing a mechanical structure integrated with an electrical component. The mechanical structure may be the mechanical structures 103 of FIGS. 1B-2D and/or any other suitable mechanical structure or body element.

The flow begins at block 301 and proceeds to block 302 where a mechanical structure is formed to provide mechanical support for an electronic device. The flow then proceeds to block 303 where one or more passivation layers are laminated to at least a portion of one or more surfaces of the mechanical structure. Next, the flow proceeds to block 304 where one or more electrically conductive traces are laminated to the passivation layer.

Although the traces are illustrated and described as being laminated to the passivation layer, it is understood that this is an example. In various implementations, one or more traces may also be laminated directly to one or more portions of one or more surfaces of the mechanical structure.

The flow then proceeds to block 305 where it is determined whether or not to add additional electrical components. If so, the flow proceeds to block 306. Otherwise, the flow proceeds to block 307 and ends.

At block 306, after it is determined to add additional electrical components, the additional electrical components are added. The flow then returns to block 305 where it s determined whether or not to add additional electrical components.

Such adding of additional components may include laminating additional passivation layers to one or more of the traces, the passivation layer, one or more surfaces of the mechanical structure, and so on. Additionally, such adding of additional components may include laminating additional traces to one or more of the traces, the passivation layer (and/or other passivation layers), one or more surfaces of the mechanical structure, and so on. Further, such adding of additional components may include adding solder (such as to one or more of the traces, the passivation layer and/or other passivation layers, one or more surfaces of the mechanical structure, and so on), mounting (such as utilizing solder or other electrical connection mechanisms) one or more other electrical components (such as one or more sensors, processing units, resistors, capacitors, and/or any other electrical component), and so on.

Although the method 300 is illustrated and described above as including particular operations performed in a particular order, it is understood that this is an example. In various implementations, different numbers of the same, similar, or different operations may be performed in a variety of orders without departing from the scope of the present disclosure.

For example, the method 300 is illustrated and described above as laminating the passivation layer and the traces. However, in various implementations, other techniques other than lamination may be utilized for forming the passivation layer and/or the traces such as patterning, vapor deposition, silk screening, printing, and/or any other suitable forming technique.

By way of another example, the method 300 illustrates and describes above that a passivation layer is laminated to the mechanical structure before traces are laminated. However, in other implementations (such as in implementations where the mechanical structure is formed of a nonconductive material), a passivation layer may not be laminated to the mechanical structure and/or traces may be laminated directly to one or more surfaces of the mechanical structure.

By way of a third example, the method 300 illustrates and describes determining whether or not to add additional electrical components after laminating traces and passivation layers. However, in various implementations such a determination may not be made and only lamination of the traces and/or passivation layers may occur.

By way of a fourth example, the method 300 illustrates and describes the passivation layer as a layer. However, in various implementations, configurations of passivation materials other than layers may be utilized without departing from the scope of the present disclosure. For example, passivation traces may be utilized instead of passivation layers.

As discussed above and illustrated in the accompanying figures, the present disclosure discloses apparatuses and methods for mechanical structures with integrated electronic components. An electronic device may include a mechanical structure that mechanically supports the electronic device. One or more traces may be formed on one or more surfaces of the mechanical structure. Other electrical components may also be mounted on the surface of the mechanical structure and may or may not be connected to one or more of the traces.

In this way, the mechanical structure may be operable to function as an electrical component of the electronic device. Such combined functionality may reduce the number of components that the electronic device would otherwise have to contain, reducing the cost, weight, and/or space requirements of the electronic device.

In the present disclosure, the methods disclosed may be implemented as sets of instructions or software readable by a device. Further, it is understood that the specific order or hierarchy of steps in the methods disclosed are examples of sample approaches. In other embodiments, the specific order or hierarchy of steps in the method can be rearranged while remaining within the disclosed subject matter. The accompanying method claims present elements of the various steps in a sample order, and are not necessarily meant to be limited to the specific order or hierarchy presented.

The described disclosure may be provided as a computer program product, or software, that may include a non-transitory machine-readable medium having stored thereon instructions, which may be used to program a computer system (or other electronic devices) to perform a process according to the present disclosure. A non-transitory machine-readable medium includes any mechanism for storing information in a form (e.g., software, processing application) readable by a machine (e.g., a computer). The non-transitory machine-readable medium may take the form of, but is not limited to, a magnetic storage medium (e.g., floppy diskette, video cassette, and so on); optical storage medium (e.g., CD-ROM); magneto-optical storage medium; read only memory (ROM); random access memory (RAM); erasable programmable memory (e.g., EPROM and EEPROM); flash memory; and so on.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

While the present disclosure has been described with reference to various embodiments, it will be understood that these embodiments are illustrative and that the scope of the disclosure is not limited to them. Many variations, modifications, additions, and improvements are possible. More generally, embodiments in accordance with the present disclosure have been described in the context or particular embodiments. Functionality may be separated or combined in blocks differently in various embodiments of the disclosure or described with different terminology. These and other variations, modifications, additions, and improvements may fall within the scope of the disclosure as defined in the claims that follow.

We claim:
1. An electronic device, comprising:
   a mechanical structure that mechanically supports the electronic device, has a first surface and a second surface, and is formed of an electrically conductive material;

traces formed on the first surface including at least a first trace that is electrically connected to the electrically conductive material;

a passivation layer on the first surface that electrically insulates at least a portion of at least one of the traces from the electrically conductive material; and an electrical component electrically coupled to the second surface wherein the first trace is electrically connected to the electrical component via an electrical path that passes through the electrically conductive material.

2. The electronic device of claim 1, wherein the passivation layer electrically insulates a portion of the first trace from the electrically conductive material.

3. The electronic device of claim 1, wherein the electrically conductive material comprises at least one of copper, silver, steel, a metal, or an alloy.

4. The electronic device of claim 1, wherein one of the traces is electrically connected to another of the traces via an electrical path that passes through the electrically conductive material.

5. The electronic device of claim 1, further comprising at least one additional passivation layer formed over the first trace.

6. The electronic device of claim 5, further comprising at least one additional trace formed over the at least one additional passivation layer wherein the at least one additional passivation layer electrically insulates the first from the at least one additional trace.

7. The electronic device of claim 1, wherein the mechanical structure comprises at least one of a middle plate or at least a portion of a housing of the electronic device.

8. The electronic device of claim 1, wherein the first trace forms at least a portion of at least one sensor.

9. The electronic device of claim 8, wherein the at least one sensor comprises at least one capacitive sensor.

10. The electronic device of claim 1, further comprising at least one additional electrical component mounted on the first surface and electrically coupled to the first trace.

11. The electronic device of claim 10, wherein the at least one additional electrical component is electrically coupled to the first utilizing solder.

12. The electronic device of claim 1, wherein the passivation layer comprises a glass-reinforced epoxy laminate.

13. The electronic device of claim 1, further comprising non-conductive material coupled to the electrically conductive material.

14. The electronic device of claim 1, wherein the non-conductive material comprises carbon fibers.

15. The electronic device of claim 1, further comprising a screen.

16. The electronic device of claim 1, wherein the electrical component comprises a sensor, processing unit, resistor, or capacitor.

17. A mechanical structure, comprising:

a conductive body element operable to mechanically support an electronic device and having first and second surfaces;

traces formed on the first surface including a first trace that is electrically connected to the conductive body element;

a passivation layer on the first surface that electrically insulates a portion of at least one of the traces from the conductive body element; and an electrical component electrically coupled to the second surface wherein the first trace is electrically connected to the electrical component via an electrical path that passes through the conductive body element.

18. The mechanical structure of claim 17, wherein the mechanical structure is component of a phone.

19. The mechanical structure of claim 17, further comprising a glass-reinforced epoxy laminate formed on the first surface.

20. A method for constructing a mechanical structure integrated with an electrical component, comprising:

forming a mechanical structure having first and second surfaces from a conductive material to provide mechanical support for an electronic device;

laminating traces to the first surface including at least a first trace;

forming a passivation layer on the first surface that electrically insulates a portion of at least one of the traces from the conductive material;

electrically connecting the first trace to the conductive material; and electrically coupling an electrical component to the second surface so that the first trace is electrically connected to the electrical component via an electrical path that passes through the conductive body element.

* * * * *